(12) United States Patent
Kim et al.

(10) Patent No.: US 12,356,830 B2
(45) Date of Patent: Jul. 8, 2025

(54) DISPLAY DEVICE

(71) Applicant: Samsung Display Co., LTD., Yongin-si (KR)

(72) Inventors: Hyun Kim, Seoul (KR); Jin Taek Kim, Yongin-si (KR); Jeong Su Park, Anyang-si (KR); Jong Chan Lee, Suwon-si (KR); Woong Hee Jeong, Seoul (KR); Jung Eun Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 737 days.

(21) Appl. No.: 17/714,940

(22) Filed: Apr. 6, 2022

(65) Prior Publication Data

US 2023/0006175 A1    Jan. 5, 2023

(30) Foreign Application Priority Data

Jul. 1, 2021   (KR) .................. 10-2021-0086399

(51) Int. Cl.
  *H10K 59/65*   (2023.01)
  *H10K 50/844*  (2023.01)
  *H10K 59/80*   (2023.01)

(52) U.S. Cl.
  CPC .......... *H10K 59/65* (2023.02); *H10K 50/844* (2023.02); *H10K 59/80521* (2023.02); *H10K 59/873* (2023.02); *H10K 59/8731* (2023.02)

(58) Field of Classification Search
  None
  See application file for complete search history.

(56) References Cited

U.S. PATENT DOCUMENTS

| 11,171,317 B2 | 11/2021 | Oh et al. | |
| 2020/0073500 A1* | 3/2020 | Jeong | H10K 50/844 |
| 2020/0175900 A1* | 6/2020 | Han | G09G 3/006 |
| 2020/0365664 A1 | 11/2020 | Jeon et al. | |
| 2024/0334737 A1* | 10/2024 | Lee | H10K 77/10 |

FOREIGN PATENT DOCUMENTS

| KR | 10-1640818 | 7/2016 |
| KR | 10-2020-0121958 | 10/2020 |
| KR | 10-2020-0130637 | 11/2020 |
| KR | 10-2020-0131400 | 11/2020 |

* cited by examiner

*Primary Examiner* — Hung K Vu
(74) *Attorney, Agent, or Firm* — KILE PARK REED & HOUTTEMAN PLLC

(57) ABSTRACT

A display device includes: a substrate having an opening area, a peripheral area surrounding the opening area, and a display area surrounding the peripheral area; a transistor disposed on the substrate; a first electrode electrically connected to the transistor; an emission layer disposed on the first electrode; a second electrode disposed on the emission layer; a first encapsulation inorganic layer, an encapsulation organic layer, and a second encapsulation inorganic layer disposed on the second electrode; and an electronic module disposed in the opening area, wherein in the peripheral area, the second electrode has a first opening exposing the emission layer, and the first encapsulation inorganic layer has a second opening exposing the emission layer.

20 Claims, 14 Drawing Sheets

DISPLAY DEVICE

CROSS REFERENCE TO RELATED APPLICATION

This application claims priority from and the benefit of Korean Patent Application No. 10-2021-0086399, filed on Jul. 1, 2021, which is hereby incorporated by reference for all purposes as if fully set forth herein.

BACKGROUND

Field

Embodiments of the invention relate generally to a display device and more specifically, to a display device including a through-hole for an electronic module.

Discussion of the Background

A display device is a device for displaying an image, and includes a liquid crystal display (LCD), an organic light emitting diode (OLED) display, and the like. Display devices are used in various electronic devices such as a mobile phone, a navigation device, a digital camera, an electronic book, a portable game machine, and various terminals.

The display device has a multi-layered structure. For example, the display device may have a multi-layered structure in which a light emitting element, a touch sensor, and the like are stacked on a substrate. An image may be displayed by light generated by the light emitting element passes through several layers of the multi-layered structure to be emitted to the outside of the display device.

The above information disclosed in this Background section is only for understanding of the background of the inventive concepts, and, therefore, it may contain information that does not constitute prior art.

SUMMARY

Display devices constructed according to the principles of the invention are capable of improving reliability by forming a groove that has an undercut shape and surrounds a through-hole of the display devices by a simplified process.

Additional features of the inventive concepts will be set forth in the description which follows, and in part will be apparent from the description, or may be learned by practice of the inventive concepts.

According to an aspect of the invention, a display device includes: a substrate having an opening area, a peripheral area surrounding the opening area, and a display area surrounding the peripheral area; a transistor disposed on the substrate; a first electrode electrically connected to the transistor; an emission layer disposed on the first electrode; a second electrode disposed on the emission layer; a first encapsulation inorganic layer, an encapsulation organic layer, and a second encapsulation inorganic layer disposed on the second electrode; and an electronic module disposed in the opening area, wherein, in the peripheral area, the second electrode has a first opening exposing the emission layer, and the first encapsulation inorganic layer has a second opening exposing the emission layer.

In a cross-sectional view, the first opening of the second electrode may have a width larger than a width of the second opening of the first encapsulation inorganic layer.

In the peripheral area, the first encapsulation inorganic layer and the second electrode may have an undercut shape in a cross-sectional view.

The encapsulation organic layer may fill the first opening of the second electrode and the second opening of the first encapsulation inorganic layer.

The encapsulation organic layer may be in contact with the emission layer exposed in the peripheral area.

The first electrode and the emission layer may extend from the display area to the peripheral area.

The second electrode may include at least two layers.

The at least two layers of the second electrode may include a layer formed of molybdenum (Mo) and a layer formed of aluminum (Al).

The display device may further include a third encapsulation inorganic layer disposed between the first encapsulation inorganic layer and the encapsulation organic layer.

The third encapsulation inorganic layer may be in contact with the emission layer exposed in the peripheral area.

The third encapsulation inorganic layer may be disposed in the first opening of the second electrode and the second opening of the first encapsulation inorganic layer.

According to another aspect of the invention, a display device includes: a substrate having an opening area, a peripheral area surrounding the opening area, and a display area surrounding the peripheral area; a transistor disposed on the substrate; a first electrode electrically connected to the transistor; an emission layer disposed on the first electrode; a second electrode disposed on the emission layer; and a first encapsulation inorganic layer, an encapsulation organic layer, and a second encapsulation inorganic layer disposed on the second electrode, wherein the first electrode and the emission layer extend from the display area to the peripheral area, and the second electrode has a first opening exposing the emission layer in the peripheral area; the first encapsulation inorganic layer has a second opening exposing an upper surface of the emission layer; and in the peripheral area, the first encapsulation inorganic layer and the second electrode form an undercut shape in a cross-sectional view.

In a cross-sectional view, the first opening may have a width larger than a width of the second opening.

The encapsulation organic layer may fill the first opening of the second electrode and the second opening of the first encapsulation inorganic layer.

The second electrode may include at least two layers.

The display device may further include a third encapsulation inorganic layer disposed between the first encapsulation inorganic layer and the encapsulation organic layer.

The third encapsulation inorganic layer may be in contact with the emission layer exposed in the peripheral area.

The third encapsulation inorganic layer may be disposed in the first opening of the second electrode and the second opening of the first encapsulation inorganic layer.

The second electrode may include aluminum.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
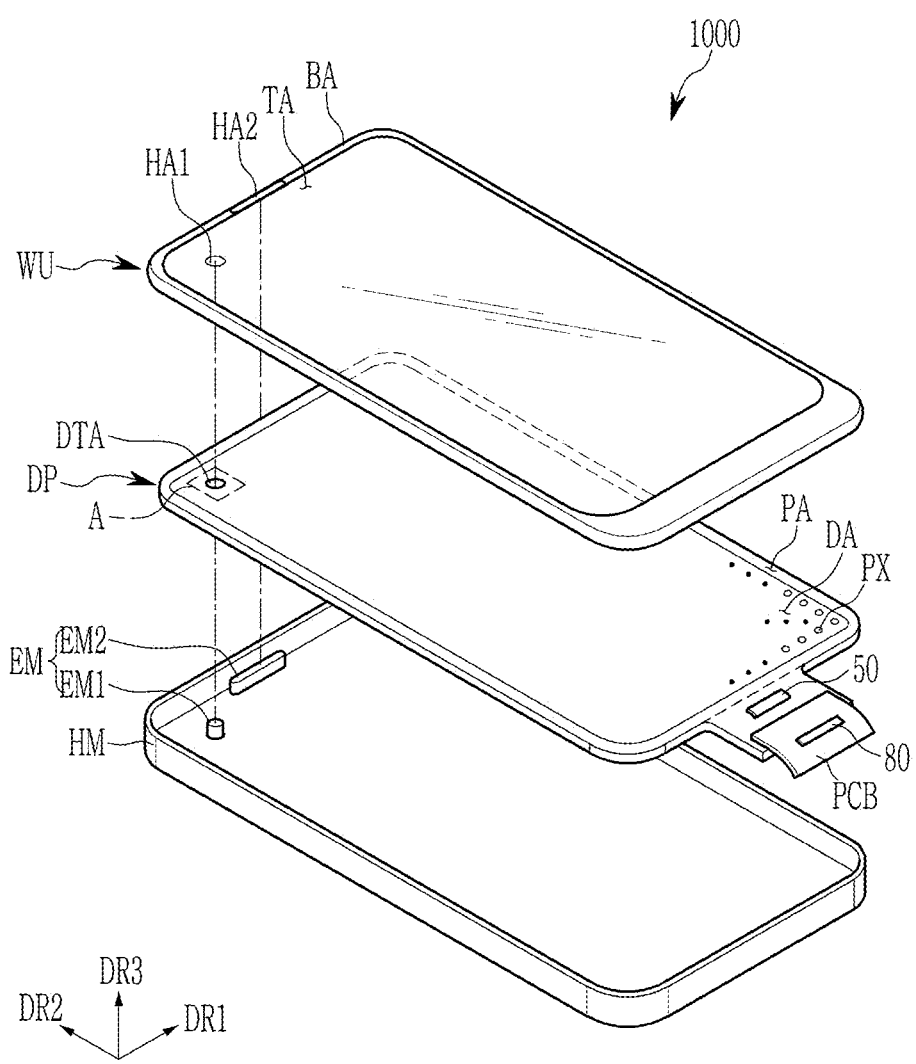
FIG. 1 illustrates an exploded perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z—axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a display device according to an embodiment will be described with reference to FIGS. 1 and 2. FIG. 1 illustrates an exploded perspective view of a display device according to an embodiment, and FIG. 2 illustrates a schematic cross-sectional view of a display device according to an embodiment.

Figure 2:
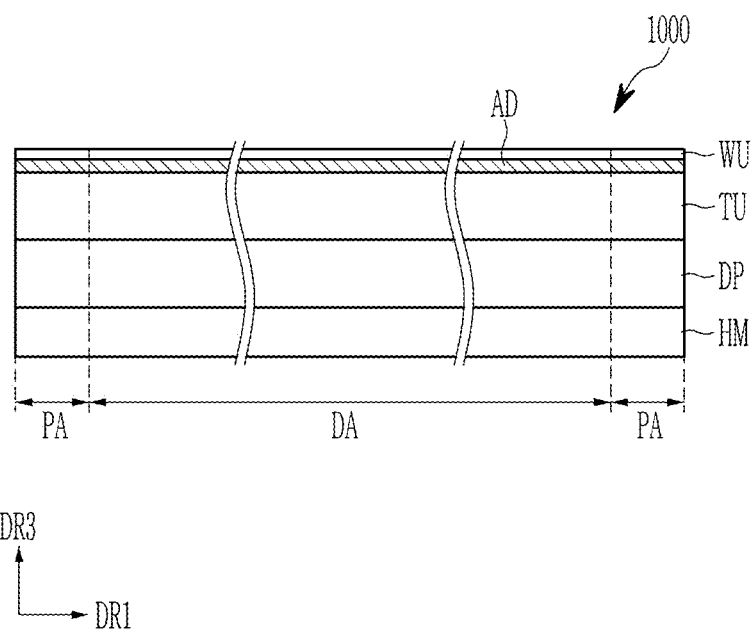
FIG. 2 illustrates a schematic cross-sectional view of another embodiment of the display device of FIG. 1.

Referring to FIGS. 1 and 2, a display device 1000 may display an image toward a third direction DR3 on a plane defined by a first direction DR1 and a second direction DR2. A front surface (e.g., upper surface) and a rear surface (e.g., lower surface) of each member are divided by a third direction DR3. Directions indicated by the first, second, and third directions DR1, DR2, and DR3 are relative concepts, thus they may be changed into other directions.

The display device 1000 may include a cover window WU, a display panel DP, and a housing member HM as illustrated in FIG. 1. In an embodiment, the cover window WU, the display panel DP, and the housing member HM may be combined to form the display device 1000.

The cover window WU may be disposed on the display panel DP to protect the display panel DP. The cover window WU may include a transmission area TA and a blocking area BA. The transmission area TA may be an optically transparent area, and may be an area through which incident light is transmitted. The blocking area BA may be an area having relatively low light transmittance compared with the transmission area TA. The blocking area BA defines a shape of the transmission area TA. The blocking area BA may surround the transmissive area TA. The blocking area BA may display a predetermined color. The blocking area BA may overlap a non-display area PA of the display panel DP to prevent the non-display area PA from being viewed from the outside.

The cover window WU may include a first hole area HA1 and a second hole area HA2. Each of the first hole area HA1 and the second hole area HA2 may overlap an electronic module EM as described in more detail later. The electronic module EM may operate by receiving external signals provided through the first hole area HA1 and the second hole area HA2.

According to an embodiment, the first hole area HA1 may be disposed in the transmission area TA, and the second hole area HA2 may be disposed in the blocking area BA. However, this is only illustrative, and the first hole area HA1 and the second hole area HA2 may be disposed in opposite areas. Alternatively, all of them may be disposed in the transmission area TA, or all of them may be disposed in the blocking area BA.

In each of the first hole area HA1 and the second hole area HA2, a predetermined depression recessed from a rear surface of the cover window WU may be defined. The depression may include a groove portion or an opening area having a smaller depth than a thickness of the cover window WU.

The first hole area HA1 and the second hole area HA2 may have different shapes. The first hole area HA1 may have a circular shape in a plan view, and the second hole area HA2 may have an elliptical shape having a long axis extending along the first direction DR1 in a plan view. However, embodiments are not limited to the shapes of the first hole area HA1 and the second hole area HA2. For example, the sizes or shapes thereof may be variously changed.

The display panel DP may be a flat rigid display panel, but embodiments are not limited thereto. For example, the display panel DP may be a flexible display panel. The display panel according to an embodiment may be a light emitting type of display panel, but embodiments are not limited thereto. For example, the display panel may be an organic light emitting display panel or a quantum dot light emitting display panel. An emission layer of the organic light emitting display panel may include an organic light emitting material. An emission layer of the quantum dot light emitting display panel may include quantum dots, quantum rods, and the like. Hereinafter, the display panel will be described as an organic light emitting display panel.

An image may be displayed on a front surface of the display panel DP. The front surface of the display panel DP may include a display area DA and a non-display area PA. An image may be displayed on the display area DA. The non-display area PA may surround the display area DA.

The display panel DP may include a plurality of pixels PX disposed in the display area DA. The pixels PX may display light in response to an electrical signal. The light displayed by the pixels PX may display an image. The number of transistors and capacitors included in one pixel PX and their connection relationship may be variously changed.

The display panel DP according to an embodiment may include an opening area DTA penetrating through the display panel DP. The opening area DTA may be disposed in the display area DA. Hereinafter, area "A" in which the opening area DTA is disposed will be described. The opening area DTA may overlap the first hole area HA1 of the cover window WU. Some of the plurality of pixels PX may be disposed to surround the opening area DTA. Accordingly, an image may be displayed even in an area adjacent to the opening area DTA.

The display panel DP may include the non-display area PA in which a plurality of signal lines and a pad part are disposed. The non-display area PA of the display panel DP may extend from the display area DA of the display panel DP. A data driver 50 may be disposed in the non-display area PA. According to an embodiment, a pad portion of the non-display area PA may be electrically connected to a printed circuit board (PCB) including a driving chip 80, which will be described in more detail below with reference to FIG. 3.

As illustrated in FIG. 2, an adhesive layer AD for bonding the display panel DP and the cover window WU may be disposed between the display panel DP and the cover window WU. For example, the adhesive layer AD may be omitted in some embodiments. In addition, as illustrated in FIG. 2, a touch sensing part TU may be disposed between the display panel DP and the cover window WU. The touch sensing part TU may be disposed on the display panel DP for a touchscreen function of the display device 1000. The touch sensing part TU may be integrally formed on the display panel DP.

The touch sensing part TU may include a touch electrode of various patterns, and may be formed as a resistive film type or a capacitance type. The touch sensing part TU may include a touch sensing area for sensing a touch and a touch peripheral area surrounding the touch sensing area.

The electronic module EM may include various functional modules for operating the display device 1000. The electronic module EM may be electrically connected to the display panel DP through a connector or the like. For example, the electronic module EM may be a camera, a speaker, or a sensing sensor using light or heat.

The electronic module EM may include a first electronic module EM1 and a second electronic module EM2. The first electronic module EM1 may sense an external object received through the opening area DTA and the first hole area HA1. The first electronic module EM1 may receive an external input transmitted through the opening area DTA and the first hole area HAL or may provide an output through the opening area DTA and the first hole area HA1.

For example, the first electronic module EM1 may be at least one of a light emitting module, a light sensing module, a photographing module, and the like. For example, the first electronic module EM1 may include at least one of a light emitting module for outputting infrared rays, a CMOS sensor for sensing infrared rays, and a camera module for photographing an external object.

The second electronic module EM2 may collect a sound signal such as voice through the second hall area HA2, or may provide a sound signal such as processed voice to the outside. For example, the second electronic module EM2 may include at least one of a sound input module and a sound output module. The sound input module may include a microphone capable of receiving a sound signal. The sound output module may include a speaker that outputs sound data as a sound signal.

However, this is illustrated as an example, and the electronic module EM may be configured of a single module, may further include a greater number of electronic modules, and may be arranged in various arrangement relationships, but embodiments are not limited thereto.

The housing member HM may be disposed at a lower side of the display panel DP. The housing member HM may be combined with the cover window WU to form an appearance of the display device 1000. The housing member HM may contain a material with relatively high rigidity. For example, the housing member HM may include a plurality of frames and/or plates made of glass, plastic, and metal. The housing member HM may provide a predetermined accommodation space. The display panel DP may be accommodated in the accommodation space to be protected from external impact.

Figure 3:
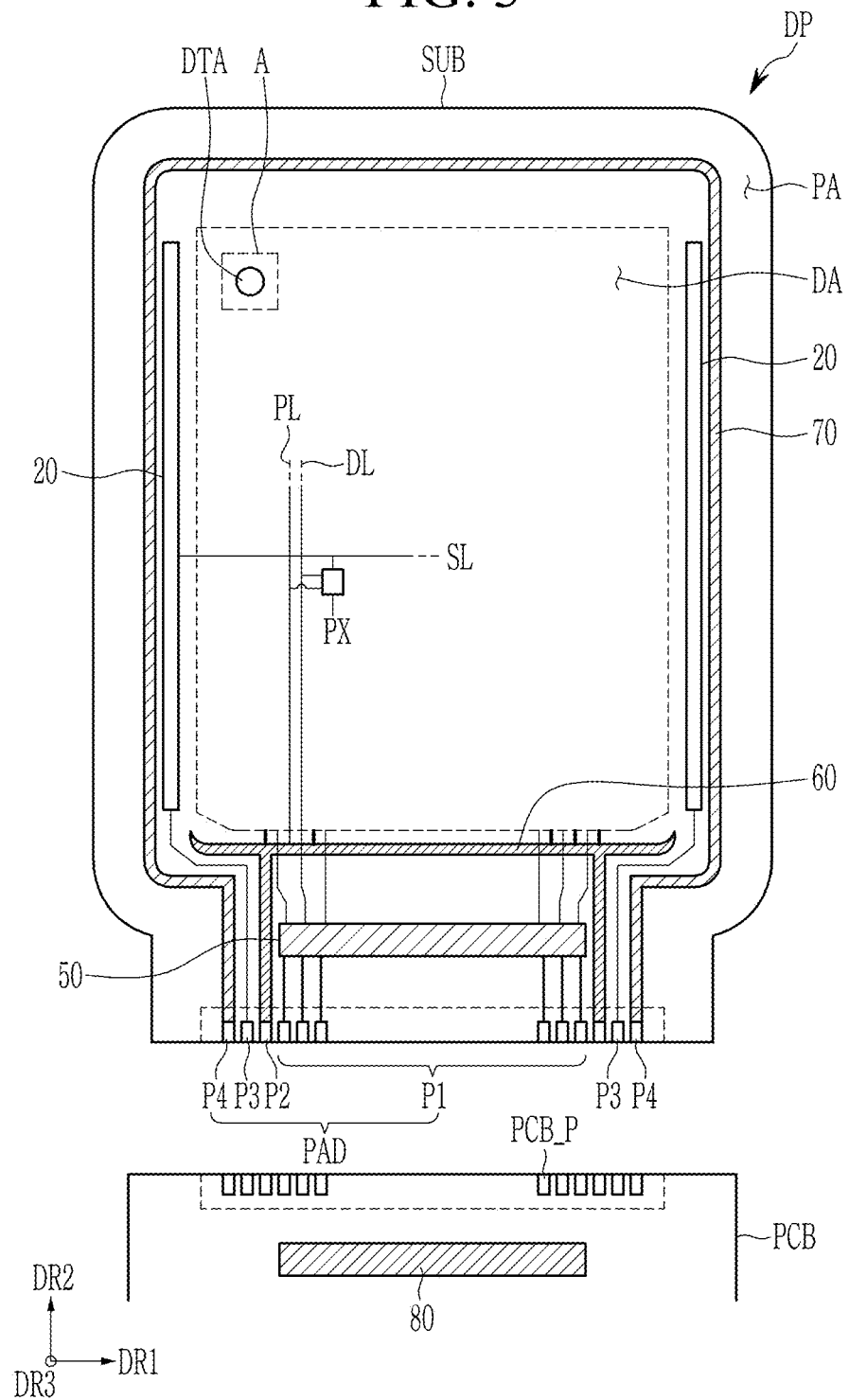
FIG. 3 illustrates a top plan view of some constituent elements of a display panel of FIGS. 1 and 2.
Figure 4:
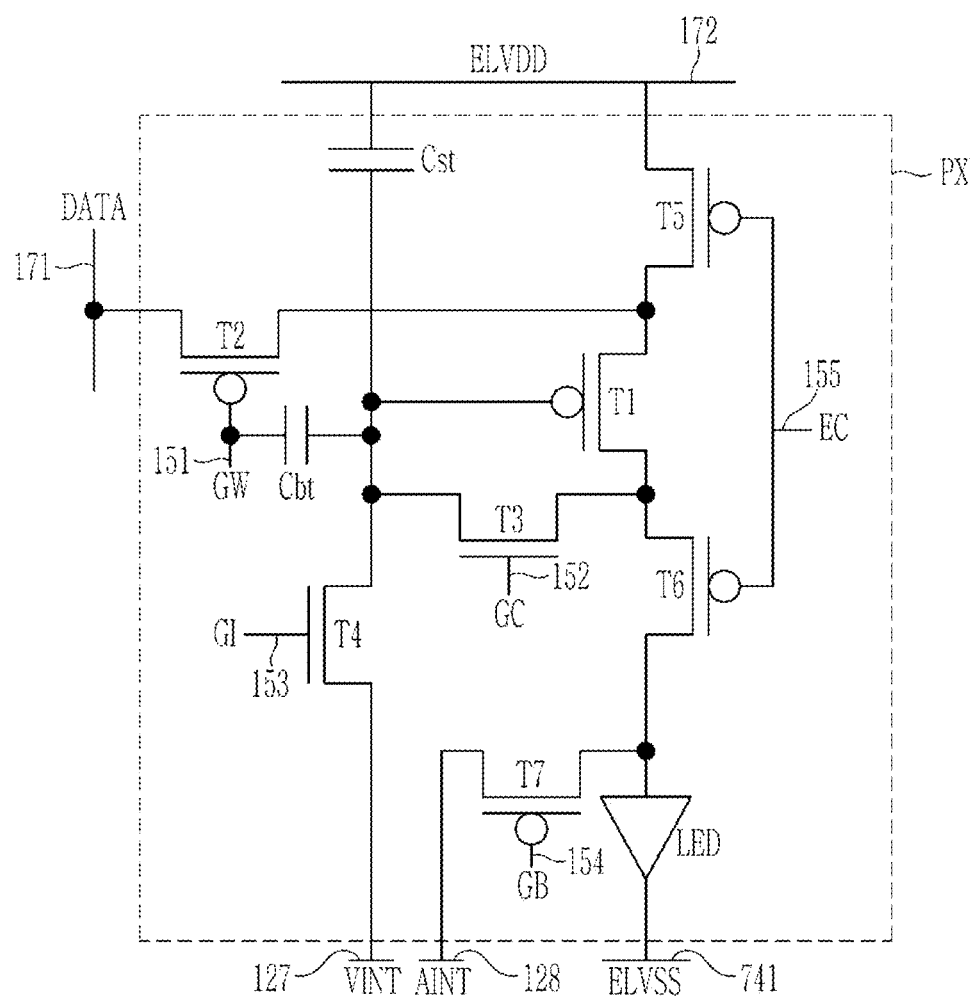
FIG. 4 illustrates a circuit diagram of a representative pixel of the display panel of FIG. 3.
Figure 5:
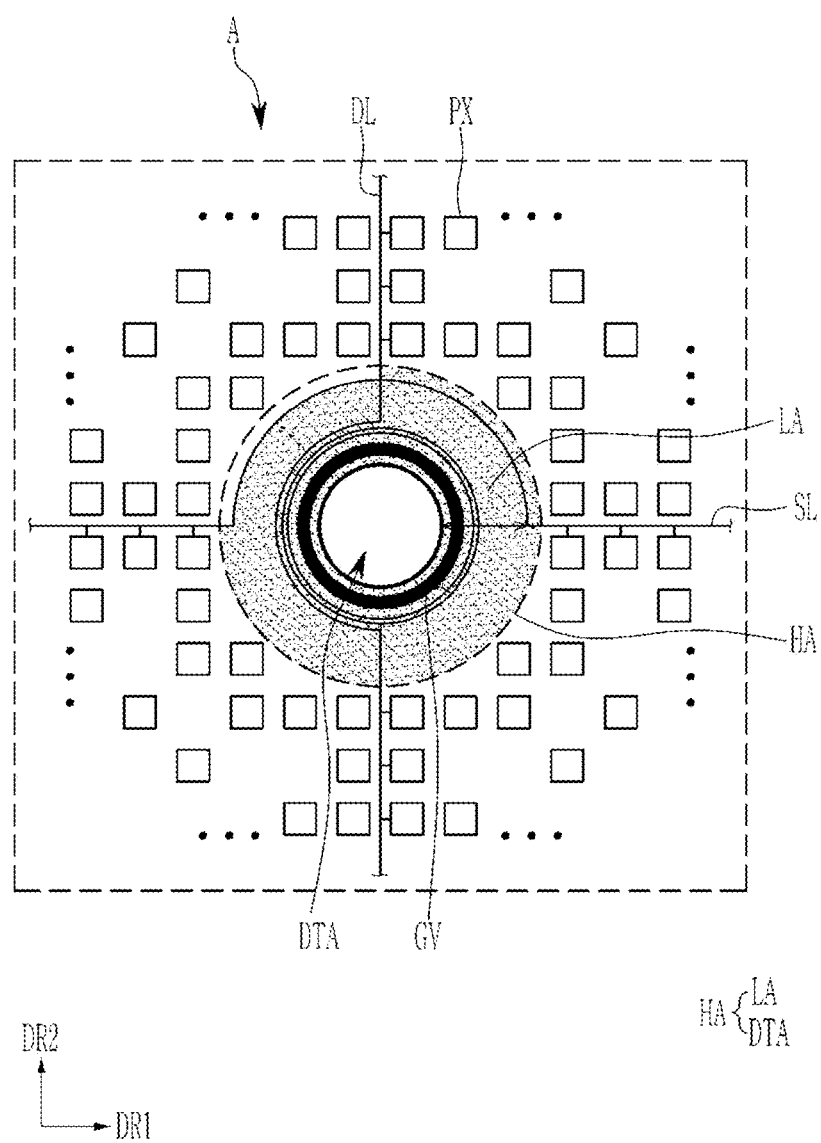
FIG. 5 illustrates a top plan view in which area "A" of FIGS. 1 and 3 is enlarged.

Hereinafter, a display panel according to an embodiment will be described with reference to FIGS. 3, 4, and 5. FIG. 3 illustrates a top plan view of some constituent elements of a display panel according to an embodiment. FIG. 4 illustrates a circuit diagram of one pixel according to an embodiment. FIG. 5 illustrates a top plan view in which area "A" of FIG. 1 and FIG. 3 is enlarged.

Referring to FIG. 3, the display panel DP may include a substrate SUB including the display area DA and the non-display area PA. The non-display area PA may be defined along an edge of the display area DA.

The display panel DP may include the plurality of pixels PX. The plurality of pixels PX may be disposed in the display area DA on the substrate SUB. Each of the pixels PX may include a light emitting element and a driving circuit connected to the light emitting element. Each pixel PX may emit, for example, red, green, blue, or white light, and may include an organic light emitting element (organic light emitting diode) as an example.

The display panel DP may include a plurality of signal lines and a pad part. The plurality of signal lines may include a scan line SL extending in the first direction DR1, and a data line DL and a driving voltage line PL extending in the second direction DR2.

A scan driver 20 may generate a scan signal, which is transmitted to each pixel PX through the scan line SL. According to an embodiment, the scan driver 20 may be disposed at left or right sides of the display area DA. In FIG. 3, a structure in which the scan driver 20 is disposed at both sides of the substrate SUB is shown, but in another embodiment, the scan driver may be disposed only at one side of the substrate SUB.

A pad part PAD may be disposed at one end portion of the display panel DP, and may include a plurality of terminals P1, P2, P3, and P4. The pad part PAD may be exposed without being covered by an insulation layer. Thus, the pad part PAD may be electrically connected to the printed circuit board PCB. The pad part PAD may be electrically connected to a pad part PCB_P of the printed circuit board PCB. The printed circuit board PCB may supply a signal or power of a driving chip 80 to the pad part PAD.

A plurality of image signals transmitted from the outside may be converted into a plurality of image data signals, and the converted signals may be transmitted to the data driver 50 through the terminal P1. In addition, a controller may receive a vertical synchronization signal, a horizontal synchronization signal, and a clock signal, and generate a control signal for controlling operations of the scan driver 20 and the data driver 50 to transmit it to each of the scan driver 20 and the data driver 50 through the terminals P3 and P1. The controller may transmit a driving voltage ELVDD to a driving voltage supply wire 60 through the terminal P2. In addition, the controller may transmit a common voltage ELVSS to each common voltage supply wire 70 through the terminal P4.

The data driver 50 may be disposed on the non-display area PA, and may generate a data signal, which is transmitted to each pixel PX. The data driver 50 may be disposed at one side of the display panel DP, and for example, may be disposed between the pad part PAD and the display area DA.

The driving voltage supply wire 60 may be disposed on the non-display area PA. For example, the driving voltage supply wire 60 may be disposed between the data driver 50 and the display area DA. The driving voltage supply wire 60 may provide the driving voltage ELVDD to the pixels PX. The driving voltage supply wire 60 may be disposed in the first direction DR1, and may be connected to a plurality of driving voltage lines PL disposed in the second direction DR2.

The common voltage supply wire 70 may be disposed on the non-display area PA. The common voltage supply wire 70 may have a shape surrounding the substrate SUB. The common voltage supply wire 70 may transmit the common voltage ELVSS to one electrode (for example, a second electrode) of the light emitting element included in the pixel PX.

Hereinafter, an example of a plurality of transistors included in one pixel will be described with reference to FIG. 4.

As illustrated in FIG. 4, one pixel PX of the display device according to an embodiment may include transistors T1, T2, T3, T4, T5, T6, and T7, a storage capacitor Cst, a boost capacitor Cbt, and a light emitting diode LED, connected to a plurality of wires.

The plurality of wires may be connected to one pixel PX. The plurality of wires may include a first initialization voltage line 127, a second initialization voltage line 128, a first scan signal line 151, a second scan signal line 152, an initialization control line 153, a bypass control line 154, a light emission control line 155, a data line 171, a driving voltage line 172, and a common voltage line 741.

The first scan signal line 151 may be connected to a gate driver for generating a first scan signal GW, and may transmit the first scan signal GW to the second transistor T2. The second scan signal line 152 may be applied with a voltage of an opposite polarity to a voltage applied to the first scan signal line 151 at the same time when a signal of the first scan signal line 151 is applied. For example, when a negative voltage is applied to the first scan signal line 151, a positive voltage may be applied to the second scan signal line 152. The second scan signal line 152 may transmit a second scan signal GC to the third transistor T3.

The initialization control line 153 may transmit an initialization control signal GI to the fourth transistor T4. The bypass control line 154 may transmit a bypass signal GB to the seventh transistor T7. The bypass control line 154 may include a previous scan signal line of the first scan signal line 151. The light emission control line 155 may transmit an emission control signal EC to the fifth transistor T5 and the sixth transistor T6.

The data line 171 may be a wire that transmits a data voltage DATA generated by a data driver, and luminance emitted by the light emitting diode LED may be changed according to the data voltage DATA applied to the pixel PX.

The driving voltage line 172 may apply a driving voltage ELVDD. The first initialization voltage line 127 may transmit a first initialization voltage VINT, and the second initialization voltage line 128 may transmit a second initialization voltage AINT. The common voltage line 741 may apply a common voltage ELVSS to a cathode electrode of the light emitting diode LED. In an embodiment, each of voltages applied to the driving voltage line 172, the first and second initialization voltage lines 127 and 128, and the common voltage line 741 may be a substantially constant voltage.

The plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor and a silicon transistor including a polycrystalline silicon semiconductor. For example, the third transistor T3 and the fourth transistor T4 may be formed as oxide transistors, and the driving transistor T1, the second transistor T2, the fifth transistor T5, the sixth transistor T6, and the seventh transistor T7 may be formed as silicon transistors. However, embodiments are not limited thereto, and the plurality of transistors may all be formed as silicon transistors.

In the above, it has been described that one pixel includes seven transistors T1 to T7, one storage capacitor Cst, and on one boost capacitor Cbt, but embodiments are not limited thereto, and the number of transistors, the number of capacitors, and their connection relationship may be variously changed.

Referring to FIG. 5 together with the above-described drawings, the display panel DP may include a plurality of signal lines SL and DL and a plurality of pixels PX disposed on the substrate. Each of the plurality of pixels PX may be connected to the plurality of signal lines SL and DL.

FIG. 5 exemplarily illustrates the scan line SL and the data line DL among a plurality of signal lines. However, this is illustrated as an example, and each of the pixels PX according to an embodiment may be additionally connected to various signal lines, but embodiments are not limited thereto.

The hole area HA included in the display panel DP may include the opening area DTA and a peripheral area LA surrounding the opening area DTA.

The peripheral area LA may be an area surrounding a periphery of the opening area DTA. A minimum width of the peripheral area LA may be required to be maintained at a substantially constant width. For example, the peripheral area LA may include a groove GV. The groove GV will be described in more detail with reference to FIG. 6A.

The scan line SL and the data line DL may have a semicircular structure or a round/curved shape, may overlap the peripheral area LA, and may bypass the opening area DTA. The plurality of scan lines SL extend in a horizontal direction along a periphery of the opening area DTA. Here, the plurality of scan lines SL may include a scan line, an emission control line, an initialization voltage line, or the like according to signals. The plurality of data lines DL extend in a vertical direction along the periphery of the opening area DTA. The plurality of data lines DL may include a driving voltage line and a driving low voltage line according to signals. In some embodiments, the plurality of scan lines SL and the plurality of data lines DL may be changed or modified.

Figure 6A:
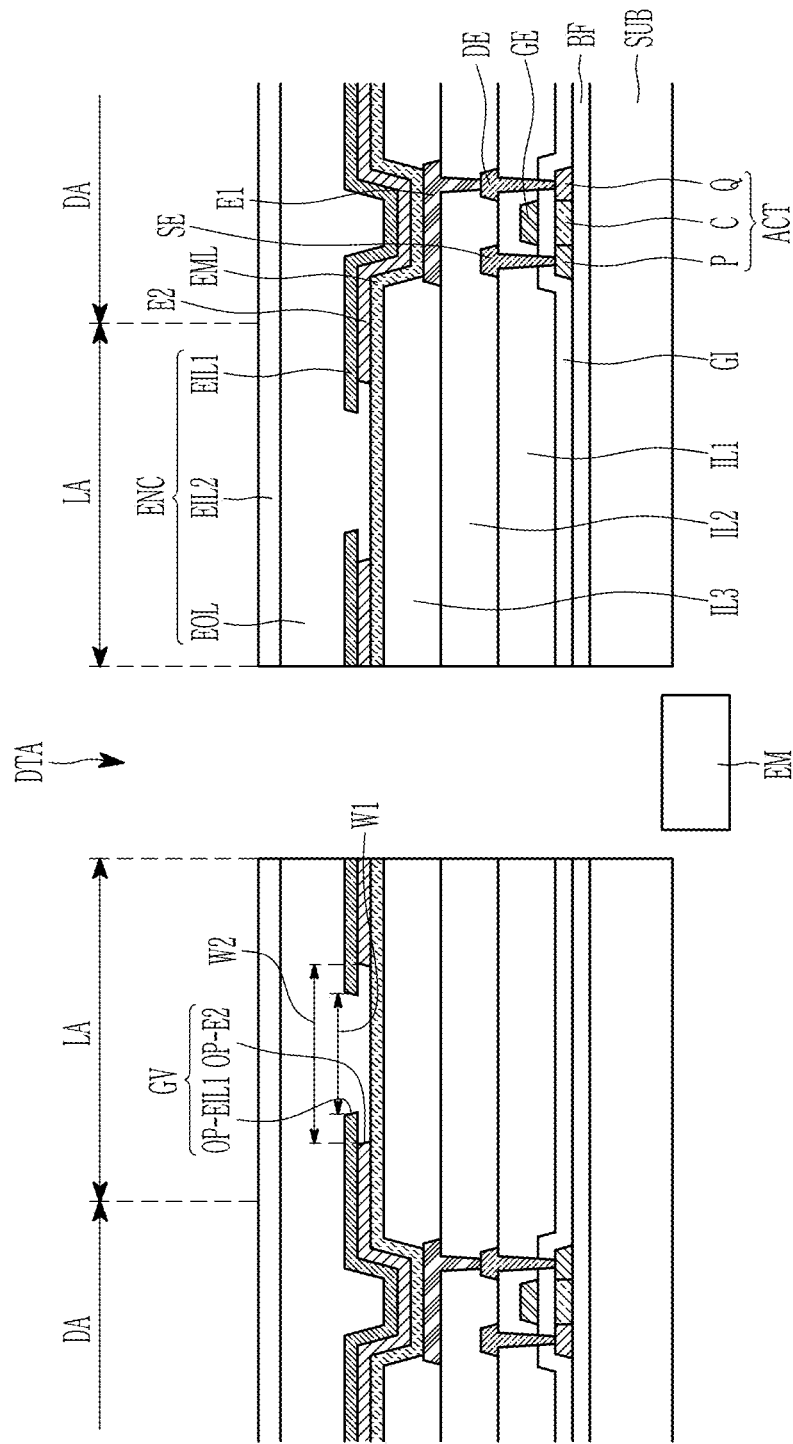
FIG. 6A and FIG. 6B respectively illustrate a cross-sectional view of an embodiment of the display panel of FIG. 3 illustrating a display area and a peripheral area thereof.

Hereinafter, a display area according to an embodiment will be described with reference to FIG. 6A. FIG. 6A illustrates a cross-sectional view of a display panel corresponding to a display area and a peripheral area.

First, a stacked structure of the display area DA will be described with reference to FIG. 6A.

The substrate SUB according to an embodiment may include an inorganic insulating material such as glass or an organic insulating material such as a plastic such as polyimide (PI). The substrate SUB may be a single-layered structure or a multi-layered structure. The substrate SUB may have a structure in which at least one base layer and at least one inorganic layer, which include polymer resins sequentially stacked, are alternately stacked.

The substrate SUB may have various degrees of flexibility. The substrate SUB may be a rigid substrate, or a flexible substrate that is bendable, foldable, or rollable.

A buffer layer BF may be disposed on the substrate SUB. The buffer layer BF may block impurities from being transmitted from the substrate SUB to an upper layer of the buffer layer BF and a semiconductor layer ACT, thereby preventing characteristic degradation of the semiconductor layer ACT and reducing stress of the semiconductor layer ACT. The buffer layer BF may include an inorganic insulating material such as a silicon nitride or a silicon oxide, or an organic insulating material. Alternatively, a portion or all of the buffer layer BF may be omitted.

The semiconductor layer ACT may be disposed on the buffer layer BF. The semiconductor layer ACT may include at least one of a polycrystalline silicon and an oxide semiconductor. The semiconductor layer ACT may include a channel region (C), a first region (P), and a second region (Q). The first region (P) and the second region (Q) may be disposed at both sides of the channel region (C), respectively. The channel region (C) may include a semiconductor with a small amount of impurity doped or a semiconductor with no impurity doped, and the first region (P) and the second region (Q) may include semiconductors with a large amount of impurity doped compared to the channel region (C). The semiconductor layer ACT may be formed of an oxide semiconductor, and in this case, a separate passivation layer may be added to protect an oxide semiconductor material that is vulnerable to external environments such as high temperature.

The gate insulating layer GI may be disposed on the semiconductor layer ACT. The gate insulating layer GI may be a single layer or multilayer including at least one of a silicon oxide (SiOx), a silicon nitride (SiNx), and a silicon oxynitride (SiOxNy).

A gate electrode GE may be disposed on the gate insulating layer GI. The gate electrode GE may be a single layer or multilayer in which metal films containing one of copper (Cu), a copper alloy, aluminum (Al), an aluminum alloy, molybdenum (Mo), a molybdenum alloy, titanium (T1), and a titanium alloy may be stacked. The gate electrode GE may overlap the channel region (C) of the semiconductor layer ACT.

A first insulating layer IL1 may be disposed on the gate electrode GE and the gate insulating layer GI. The first insulating layer IL1 may be a single layer or multilayer including at least one of a silicon oxide (SiOx), a silicon nitride (SiNx), and a silicon oxynitride (SiOxNy).

A source electrode SE and a drain electrode DE may be disposed on the first insulating layer IL1. The source electrode SE and the drain electrode DE may be connected to the first region (P) and the second region (Q) of the semiconductor layer ACT through a contact hole formed in the first insulating layer ILL respectively.

The source electrode CE and the drain electrode DE may include aluminum (Al), silver (Ag), magnesium (Mg), gold (Au), nickel (Ni), chromium (Cr), calcium (Ca), molybdenum (Mo), titanium (T1), tungsten (W), and/or copper (Cu), and may have a single-layered structure or a multi-layered structure including them.

A second insulating layer IL2 may be disposed on the first insulating layer ILL the source electrode SE, and the drain electrode DE. The second insulating layer IL2 may include an organic insulating material such as a general purpose polymer such as polymethyl methacrylate (PMMA) or polystyrene (PS), a polymer derivative having a phenolic group, a acryl-based polymer, an imide-based polymer, a polyimide, an acryl-based polymer, and a siloxane-based polymer.

A first electrode E1 may be disposed on the second insulating layer IL2. The first electrode E1 may be electrically connected to the drain electrode DE through a contact hole of the second insulating layer IL2.

The first electrode E1 may contain a metal such as silver (Ag), lithium (Li), calcium (Ca), aluminum (Al), magnesium (Mg), or gold (Au), and may also contain a transparent conductive oxide (TCO) such as an indium tin oxide (ITO) or an indium zinc oxide (IZO). The first electrode E1 may be formed of a single layer including a metal material or a transparent conductive oxide, or a multilayer including them. For example, the first electrode E1 may have a triple-layered structure of indium tin oxide (ITO)/silver (Ag)/indium tin oxide (ITO).

A transistor configured of the gate electrode GE, the semiconductor layer ACT, the source electrode SE, and the drain electrode DE may be connected to the first electrode E1 to supply a current to a light emitting element.

A partition wall IL3 may be disposed on the second insulating layer IL2 and the first electrode E1. For example, a spacer may be disposed on the partition wall IL3.

The partition wall IL3 may overlap at least a portion of the first electrode E1, and has a partition wall opening defining a light emitting region. The partition wall opening may have a planar shape substantially similar to that of the first electrode E1. The partition wall opening may have a rhombus or octagonal shape similar to a rhombus in a plan view, but embodiments are not limited thereto. For example, the partition wall opening may have various shapes such as a quadrangle, a polygon, or a circle.

The partition wall IL3 and the spacer may include an organic insulating material such as a general polymer such as polymethyl methacrylate (PMMA) or polystyrene (PS), a polymer derivative having a phenolic group, an acryl-based polymer, an imide-based polymer, a polyimide, an acryl-based polymer, and a siloxane-based polymer.

An emission layer EML may be disposed on the first electrode E1 overlapping the partition wall opening. The emission layer EML may include an organic material and/or an inorganic material. The emission layer EML may generate predetermined colored light. The emission layer EML may be formed to be disposed only within the partition wall opening by using a mask.

The emission layer EML may be a multi-film including at least one of a hole injection layer (HIL) and a hole transporting layer (HTL) and including at least one of an electron transporting layer (ETL) and an electron injection layer (EIL).

A second electrode E2 may be disposed on the emission layer EML. The second electrode E2 may include a reflective metal including calcium (Ca), barium (Ba), magnesium (Mg), aluminum (Al), silver (Ag), gold (Au), nickel (Ni), chromium (Cr), lithium (Li), calcium (Ca), or molybdenum (Mo) or a transparent conductive oxide (TCO) such as an indium tin oxide (ITO) or an indium zinc oxide (IZO).

The first electrode E1, the emission layer EML, and the second electrode E2 may form a light emitting element. Here, the first electrode E1 may be an anode, which is a hole injection electrode, and the second electrode E2 may be a cathode, which is an electron injection electrode. However, embodiments are not limited thereto, and the first electrode E1 may be a cathode and the second electrode E2 may be an anode, according to a driving method of the light emitting display device.

Holes and electrons may be injected into the emission layer EML from the first electrode E1 and second electrode E2, respectively, and light may be emitted when excitons, which are generated by the combination of the injected holes and electrons, become a ground state from an excited state.

An encapsulation layer ENC may be disposed on the second electrode E2. The encapsulation layer ENC may cover and seal not only an upper surface but also a side surface of the light emitting element. Since the light emitting element is very vulnerable to moisture and oxygen, the encapsulation layer ENC may seal or encapsulate the light emitting element to block inflow of moisture and oxygen from the outside.

The encapsulation layer ENC may include a plurality of layers, and in this case, it may be formed as a composite film including both an inorganic layer and an organic layer, and for example, it may be formed as a triple layer. For example, the encapsulation layer ENC may be formed by sequentially stacking a first encapsulation inorganic layer EIL1, an encapsulation organic layer EOL, and a second encapsulation inorganic layer EIL2.

The first encapsulation inorganic layer EIL1 may cover the second electrode E2. The first encapsulation inorganic layer EIL1 may prevent external moisture or oxygen from penetrating into the light emitting element. For example, the first encapsulation inorganic layer EIL1 may include a silicon nitride, a silicon oxide, a silicon oxynitride, or a combination thereof. The first encapsulation inorganic layer EIL1 may be formed by a deposition process.

The encapsulation organic layer EOL may be disposed on the first encapsulation inorganic layer EIL1 to contact the first encapsulation inorganic layer EIL1. Curved portions formed on an upper surface of the first encapsulation inorganic layer EIL1 or particles of being disposed on the first encapsulation inorganic layer EIL1 may be covered by the encapsulation organic layer EOL. Thus, influence on constituent elements, which are formed on the encapsulation organic layer EOL by the surface state of the upper surface of the first encapsulation inorganic layer EIL1 may be blocked or minimized. In addition, the encapsulation organic layer EOL may reduce stress between layers in contact with each other. The encapsulation organic layer EOL may include an organic material, and may be formed by a solution process such as a spin coating, slit coating, or inkjet process.

The second encapsulation inorganic layer EIL2 may be disposed on the encapsulation organic layer EOL to cover the encapsulation organic layer EOL. The second encapsulation inorganic layer EIL2 may be stably or uniformly formed on a relatively flat surface compared to the first encapsulation inorganic layer EIL1. The second encapsulation inorganic layer EIL2 may encapsulate moisture discharged from the encapsulation organic layer EOL to prevent outflow to the outside. The second encapsulation inorganic layer EIL2 may include a silicon nitride, a silicon oxide, a silicon oxynitride, or a combination thereof. The second encapsulation inorganic layer EIL2 may be formed by a deposition process.

For example, a capping layer disposed between the second electrode E2 and the encapsulation layer ENC may be further included. The capping layer may include an organic material. The capping layer may protect the second electrode E2 from a subsequent process, for example, a sputtering process, and may improve light emitting efficiency of the light emitting element. The capping layer may have a refractive index larger than that of the first encapsulation inorganic layer EIL1.

Hereinafter, the peripheral area LA disposed between the opening area DTA and the display area DA will be described.

The substrate SUB, the buffer layer BF, the gate insulating layer GI, the first insulating layer IL1, the second insulating layer IL2, and the partition wall IL3 extending from the display area DA may be disposed in the peripheral area LA. In addition, the emission layer EML extending from the display area DA may be disposed in the peripheral area LA. In the descriptions, an embodiment in which the emission layer EML overlaps the front surface of the substrate SUB is shown, and in this case, the emission layer EML extending to the peripheral area LA may include at least one of a hole injection layer, a hole transporting layer, an electron injection layer, and an electron transporting layer according to an embodiment.

Each of the second electrode E2 and the first encapsulation inorganic layer EIL1 in the peripheral area LA may include an opening. The second electrode E2 may include a first opening OP-E2, and the first encapsulation inorganic layer EIL1 may include a second opening OP-EIL1. The first opening OP-E2 and the second opening OP-EIL1 may overlap each other, and may form the groove GV as described in FIG. 5. The groove GV may have a closed line shape surrounding a through-hole formed in the opening area DTA. The groove GV may have a circular shape similar to the through-hole shape. However, this is an example, and the groove GV may have a shape that is different from the through-hole, it may have a polygonal shape, an elliptical shape, or a closed line shape including at least partial curved line, or it may have a shape including a plurality of patterns that are partially disconnected. However, it is not limited to embodiments described above.

The second electrode E2 may have a disconnected shape in the first opening OP-E2, and the first encapsulation inorganic layer EIL1 may have a disconnected shape in the second opening OP-EIL1. The first opening OP-E2 may expose a portion of the emission layer EML extending to the peripheral area LA, and the second opening OP-EIL1 may expose a portion of the emission layer EML extending to the peripheral area LA.

According to an embodiment, a width W2 of the first opening OP-E2 in a cross-sectional view may be larger than a width W1 of the second opening OP-EIL1. For example, the first opening OP-E2 and the second opening OP-EIL1 may have an undercut shape in a cross-sectional view. An end of the first encapsulation inorganic layer EIL1 forming the second opening OP-EIL1 may have a protruding shape with more than the end of the second electrode E2 forming the first opening OP-E2. For example, the second opening OP-EIL1 of the first encapsulation inorganic layer EIL1 may have a size (e.g., a diameter) smaller than that of the first opening OP-E2 of the second electrode E2 in a plan view. For example, the first opening OP-E2 of the second electrode E2 may surround the second opening OP-EIL1 of the first encapsulation inorganic layer EIL1 in a plan view.

The encapsulation organic layer EOL may be disposed on the first encapsulation inorganic layer EIL1 in the peripheral area LA. The encapsulation organic layer EOL may fill the first opening OP-E2 and the second opening OP-EIL1. The encapsulation organic layer EOL may completely fill the first opening OP-E2 of the second electrode E2 formed in the undercut shape. The encapsulation organic layer EOL may contact the emission layer EML through the first opening OP-E2 and the second opening OP-EIL1. For example, the encapsulation organic layer EOL may contact the emission layer EML and the second electrode E2, e.g., a side surface of the second electrode E2. For example, a portion of encapsulation organic layer EOL may be disposed between the end of the first encapsulation inorganic layer EIL1 and the emission layer EML, e.g., in the third direction DR3. For example, the encapsulation organic layer EOL may include an upper portion covering the first encapsulation inorganic layer EIL1 and a lower portion filling the first opening OP-E2 of the second electrode E2. For example, the first encapsulation inorganic layer EIL1 may be disposed between the upper portion and the lower portion of the encapsulation organic layer EOL, e.g., in the third direction DR3.

The second encapsulation inorganic layer EIL2 extending from the display area DA to the peripheral area LA may be disposed on the encapsulation organic layer EOL.

The first electronic module EM1 may be disposed in the opening area DTA where the through-hole is disposed according to an embodiment. For example, an encapsulation member disposed along a boundary of the opening area DTA may be further included. The encapsulation member may cover a side surface of the second encapsulation inorganic layer EIL2 from the substrate SUB exposed by the opening area DTA. The encapsulation member may include the same material as the sealing member.

According to an embodiment, it is possible to partially remove the second electrode and the first encapsulation inorganic layer in the peripheral area, and provide an undercut shape. An area for providing the undercut structure may be reduced, and the encapsulation organic layer disposed on the undercut structure may provide a flat upper surface. In addition, the encapsulation organic layer may stably and uniformly fill the undercut structure without bubble defects. It is therefore possible to provide a display device with improved reliability.

Figure 6B:
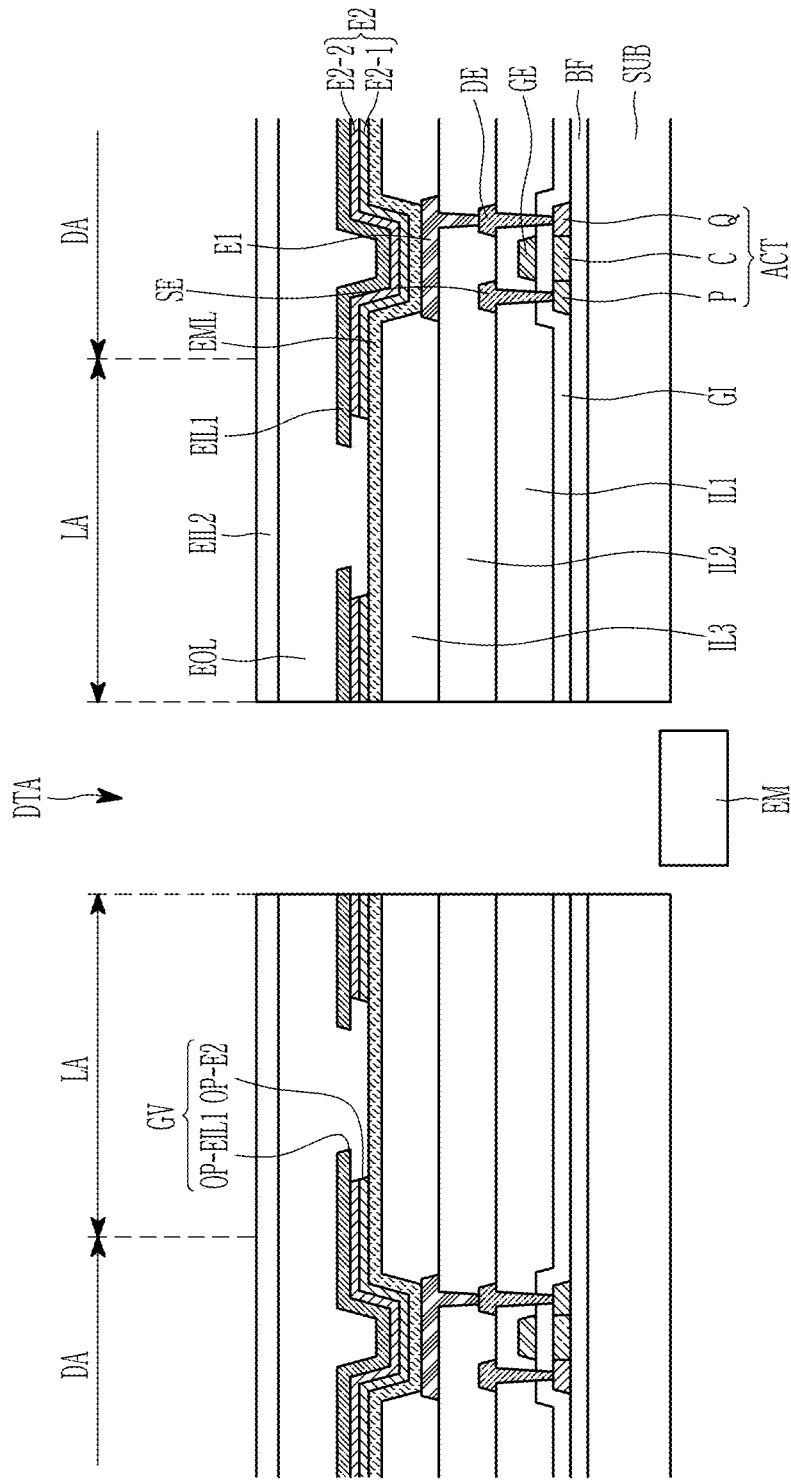
Figure 7:
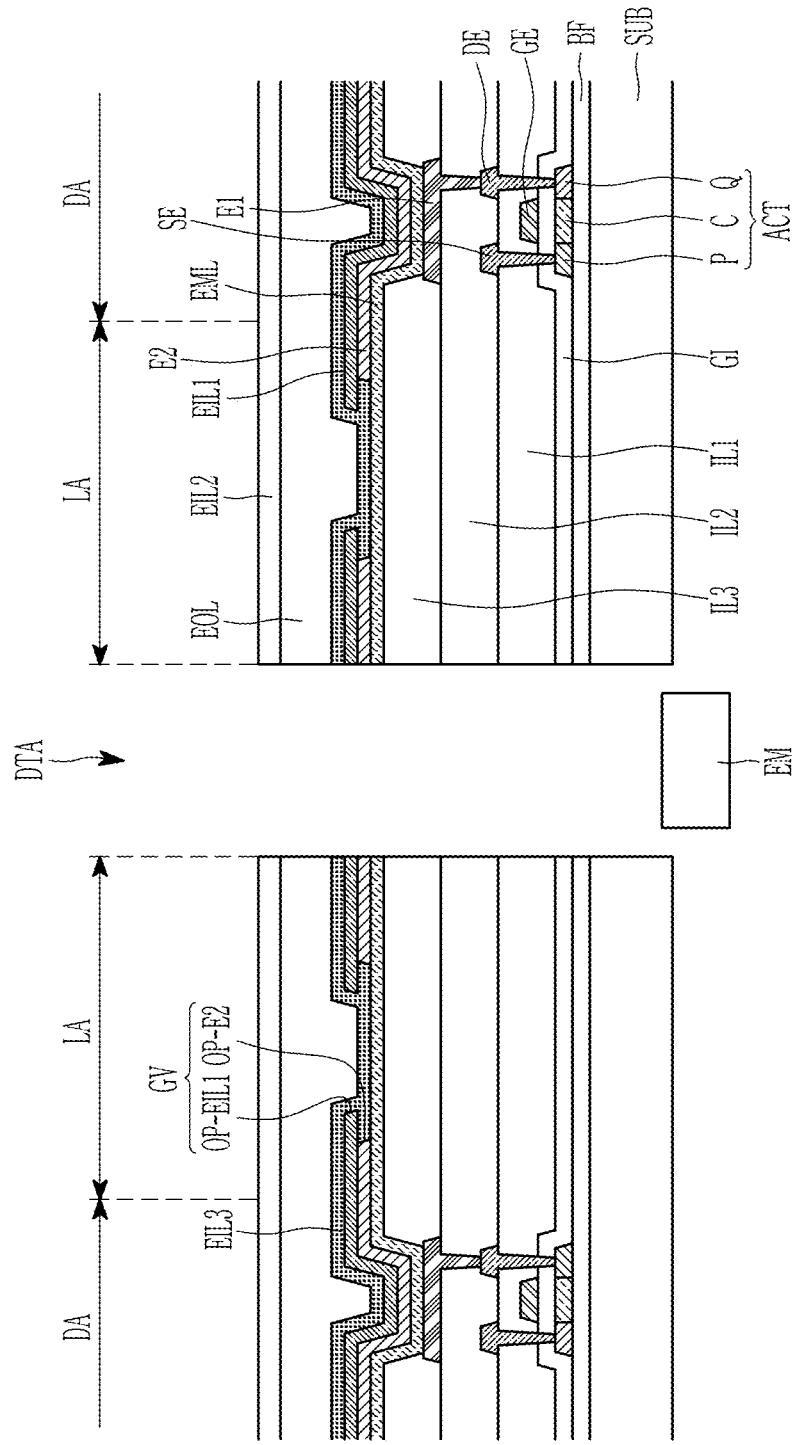
FIG. 7 illustrates a cross-sectional view of another embodiment of the display panel of FIG. 3 illustrating the display area and the peripheral area thereof.

Hereinafter, a display panel according to an embodiment will be described with reference to FIG. 6B and FIG. 7. FIG. 6B and FIG. 7 illustrate cross-sectional views of a display panel corresponding to a display area and a peripheral area. A description of the same constituent element as that described above will be omitted for descriptive convenience.

First, referring to FIG. 6B, the second electrode E2 according to an embodiment may be formed as a double layer. The second electrode E2 may include a (2-1)-th electrode E2-1 and a (2-2)-th electrode E2-2.

The (2-1)-th electrode E2-1 and the (2-2)-th electrode E2-2 may include different metals. For example, one of the (2-1)-th electrode E2-1 and the (2-2)-th electrode E2-2 may include aluminum (Al), and the other thereof may include molybdenum (Mo). A layer including aluminum (Al) may be disposed to be adjacent to the emission layer EML, or a layer including molybdenum (Mo) may be disposed to be adjacent to the emission layer EML.

The (2-1)-th electrode E2-1 and the (2-2)-th electrode E2-2 having different metals may have different etching rates during the manufacturing process. The descriptions show a shape in which the (2-1)-th electrode E2-1 and the (2-2)-th electrode E2-2 have aligned ends, but embodiments are not limited thereto. For example, the end of the (2-1)-th electrode E2-1 may protrude more than the end of the (2-2)-th electrode E2-2, or the end of the (2-2)-th electrode E2-2 may protrude more than the end of the (2-1)-th electrode E2-1.

Next, referring to FIG. 7, the display device according to an embodiment may further include a third encapsulation inorganic layer EIL3 disposed between the first encapsulation inorganic layer EIL1 and the encapsulation organic layer EOL. The third encapsulation inorganic layer EIL3 may overlap the front surface of the substrate SUB.

The third encapsulation inorganic layer EIL3 may include a silicon nitride, a silicon oxide, a silicon oxynitride, or a combination thereof. The third encapsulation inorganic layer EIL3 may be formed through a deposition process.

The third encapsulation inorganic layer EIL3 may overlap the first opening OP-E2 and the second opening OP-EIL1. The third encapsulation inorganic layer EIL3 may be disposed in the first opening OP-E2 and the second opening OP-EIL1, and may cover the ends of the first encapsulation inorganic layer EIL1 and the second electrode E2 forming the first opening OP-E2 and the second opening OP-EIL1.

The third encapsulation inorganic layer EIL3 may be in contact with the emission layer EML exposed by the first opening OP-E2 and the second opening OP-EIL1. For example, the third encapsulation inorganic layer EIL3 may contact the emission layer EML and the second electrode E2, e.g., the side surface of the second electrode E2. For example, a portion of the third encapsulation inorganic layer EIL3 may be disposed between the end of the first encapsulation inorganic layer EIL1 and the emission layer EML, e.g., in the third direction DR3. For example, the third encapsulation inorganic layer EIL3 may include an upper portion covering the first encapsulation inorganic layer EIL1 and a lower portion filling the first opening OP-E2 of the second electrode E2. For example, the first encapsulation inorganic layer EIL1 may be disposed between the upper portion and the lower portion of the third encapsulation inorganic layer EIL3, e.g., in the third direction DR3.

Hereinafter, a manufacturing method of a display panel according to an embodiment will be described with reference to FIGS. 8A, 8B, 8C, 8D, and 8E. FIGS. 8A, 8B, 8C, 8D, and 8E illustrate cross-sectional views of a display panel according to a manufacturing process according to an embodiment. A description of the same constituent elements as that described above will be omitted for descriptive convenience.

Figure 8A:
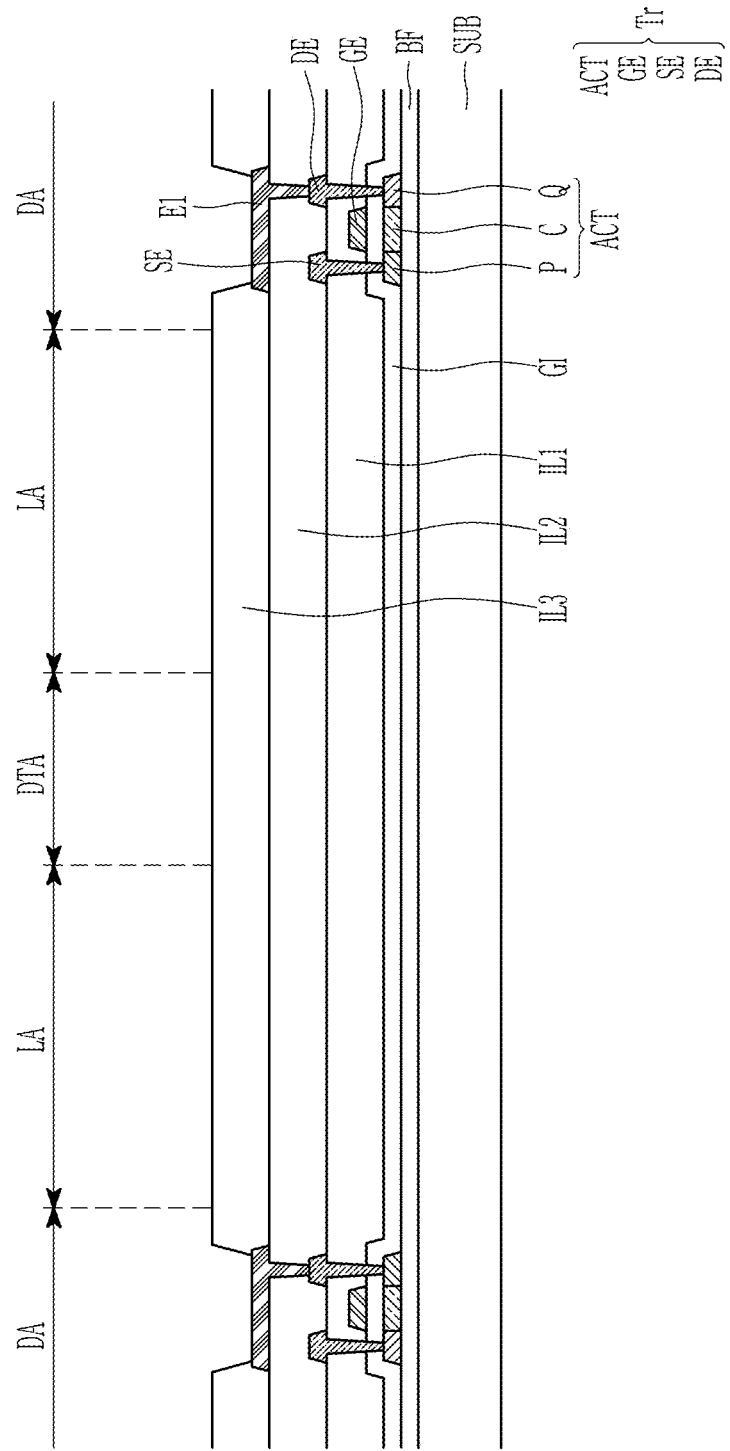
FIGS. 8A, 8B, 8C, 8D, and 8E illustrate cross-sectional views of the display panel FIG. 3 illustrating a manufacturing process according to an embodiment.

Referring to FIG. 8A, the buffer layer BF, the gate insulating layer GI, the first insulating layer ILL the second insulating layer IL2, the transistor Tr, the first electrode E1, and the partition wall IL3 may be formed on the substrate SUB according to an embodiment. This may be performed in various techniques or processes.

Figure 8B:
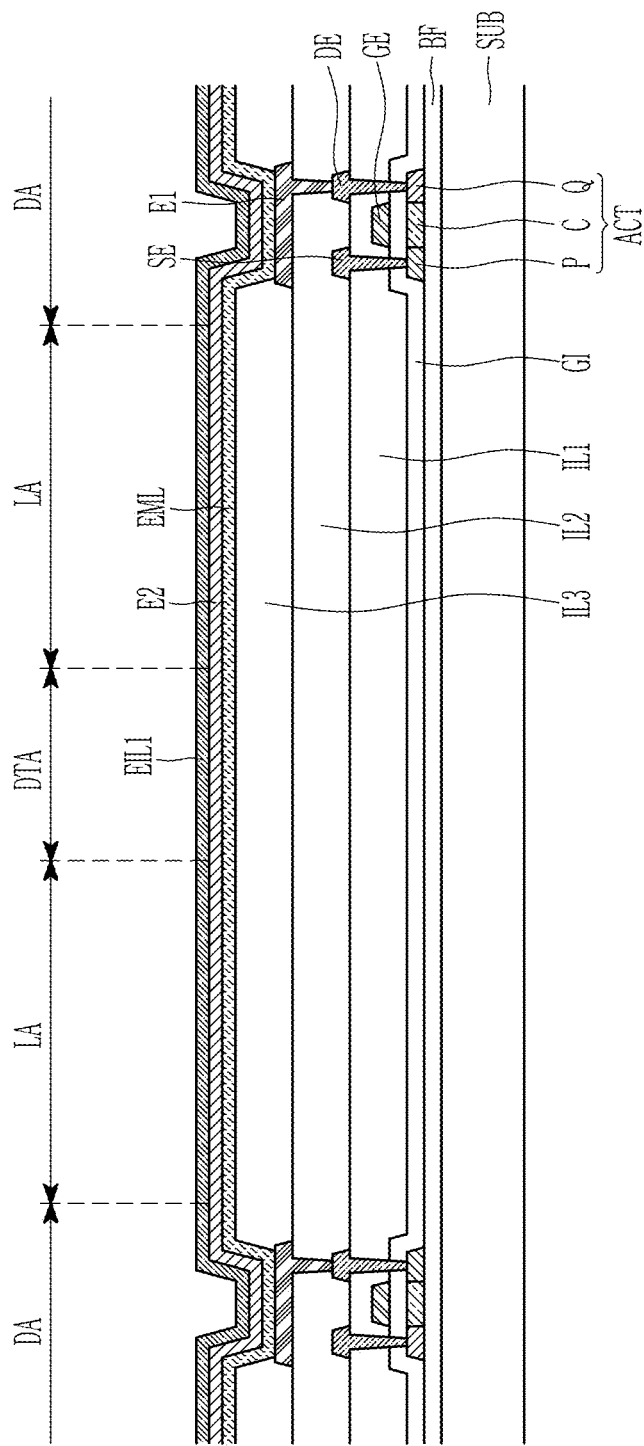

Then, as illustrated in FIG. 8B, the emission layer EML, the second electrode E2, and the first encapsulation inorganic layer EIL1 may be formed to overlap the entire surface of the substrate SUB.

Figure 8C:
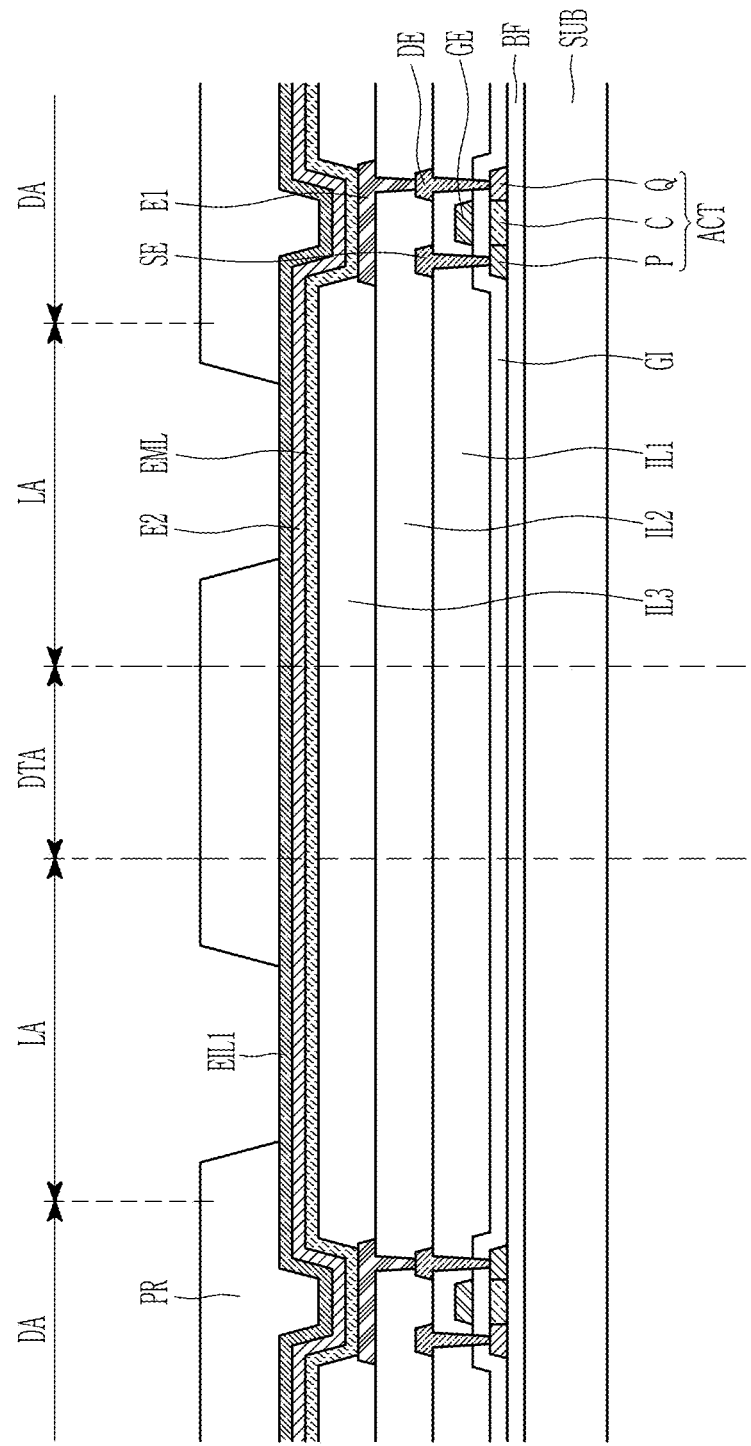

Next, as illustrated in FIG. 8C, a photosensitive pattern PR may be formed on the first encapsulation inorganic layer EIL1. The photosensitive pattern PR may function as a mask for forming an opening in the second electrode E2 and the first encapsulation inorganic layer EIL1.

Figure 8D:
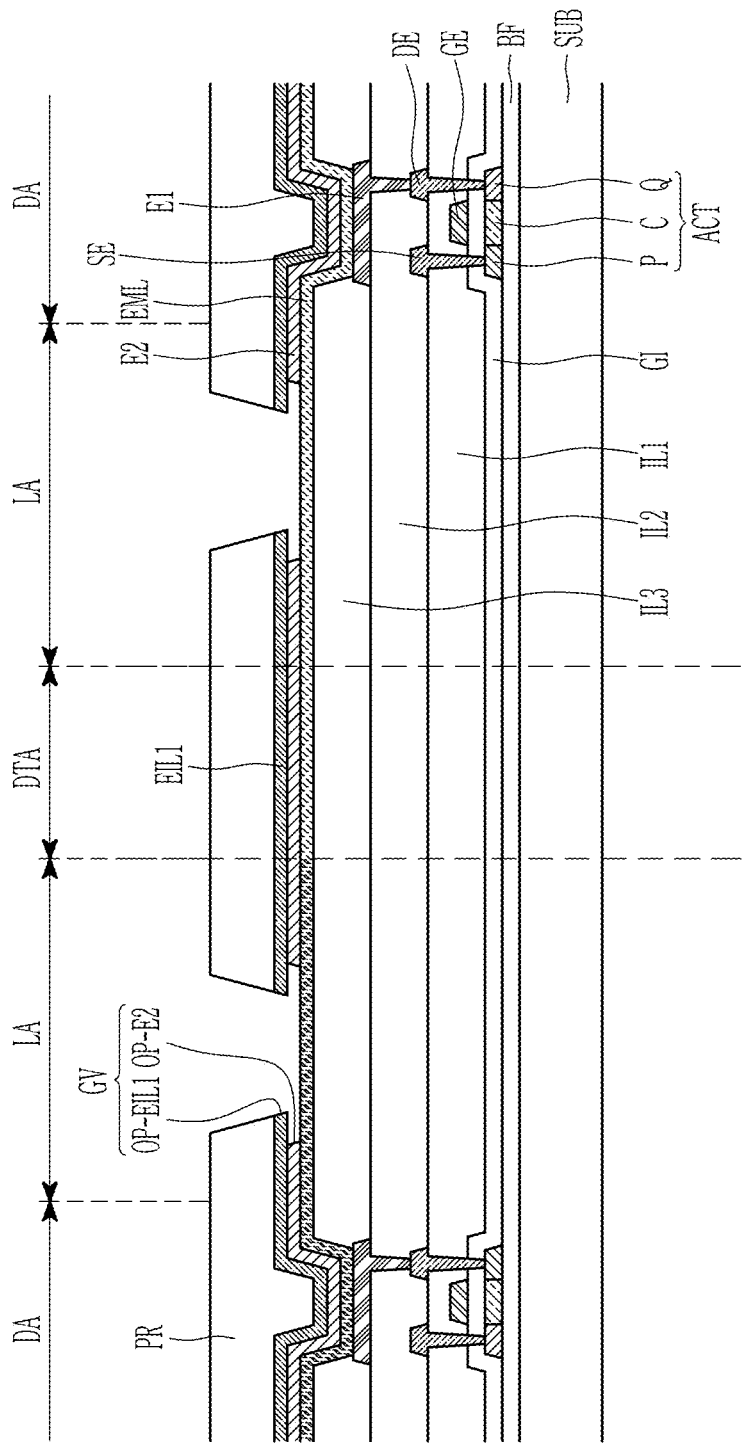

Then, as illustrated in FIG. 8D, the first encapsulation inorganic layer EIL1 and the second electrode E2 may be patterned by using the photosensitive pattern PR as a mask. In this case, tetra methyl ammonium hydroxide (TMAH) may be used in an etching process using the photosensitive pattern PR, but embodiments are not limited thereto.

Through the etching process, the second electrode E2 may be formed to include the first opening OP-E2, and the first encapsulation inorganic layer EIL1 may be formed to include the second opening OP-EIL1. Particularly, in a cross-sectional view, a width of the first opening OP-E2 may be formed to be larger than that of the second opening OP-EIL1, e.g., in a plan view. For example, the first opening OP-E2 and the second opening OP-EIL1 may be formed to have an undercut shape in a cross-sectional view. For example, the first opening OP-E2 of the second electrode E2 may have a size (e.g., a diameter) larger than that of the second opening OP-EIL1 of the first encapsulation inorganic layer EIL1 in a plan view. For example, the first opening OP-E2 of the second electrode E2 may surround the second opening OP-EIL1 of the first encapsulation inorganic layer EIL1 in a plan view.

Figure 8E:
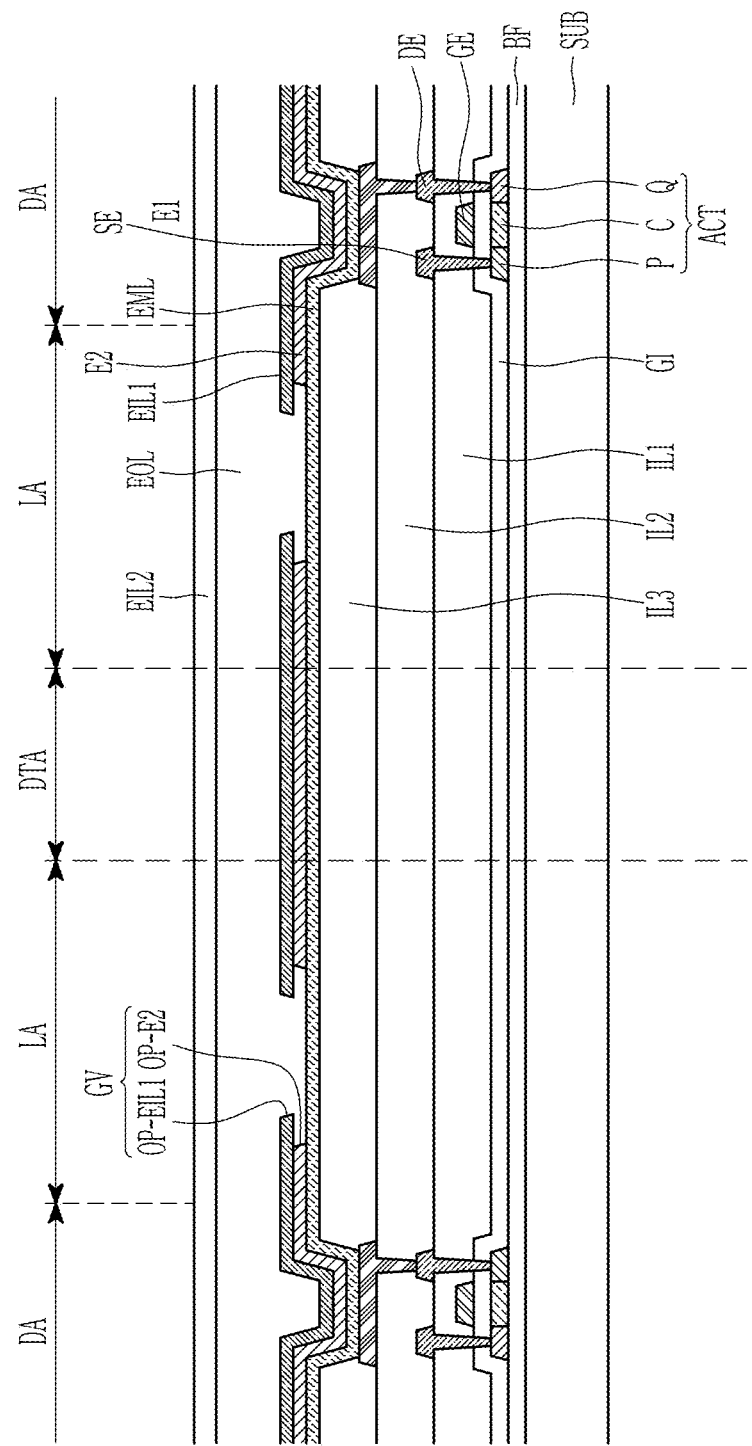

Next, the photosensitive pattern PR may be removed, and as illustrated in FIG. 8E, the encapsulation organic layer EOL and the second encapsulation inorganic layer EIL2 overlapping the entire surface of the substrate SUB may be formed. Then, a through-hole passing through the opening area DTA may be formed to provide the display panel as illustrated in FIG. 6A.

According to an embodiment, the manufacturing process of the display device may be simplified by performing the simplified etching process. In addition, a step and an undercut shape are provided only by the openings formed on the second electrode and the first encapsulation inorganic layer. Thus, the encapsulation organic layer formed on the upper portion may be stably and uniformly formed without bubble defects or an excessive step.

Figure 9:
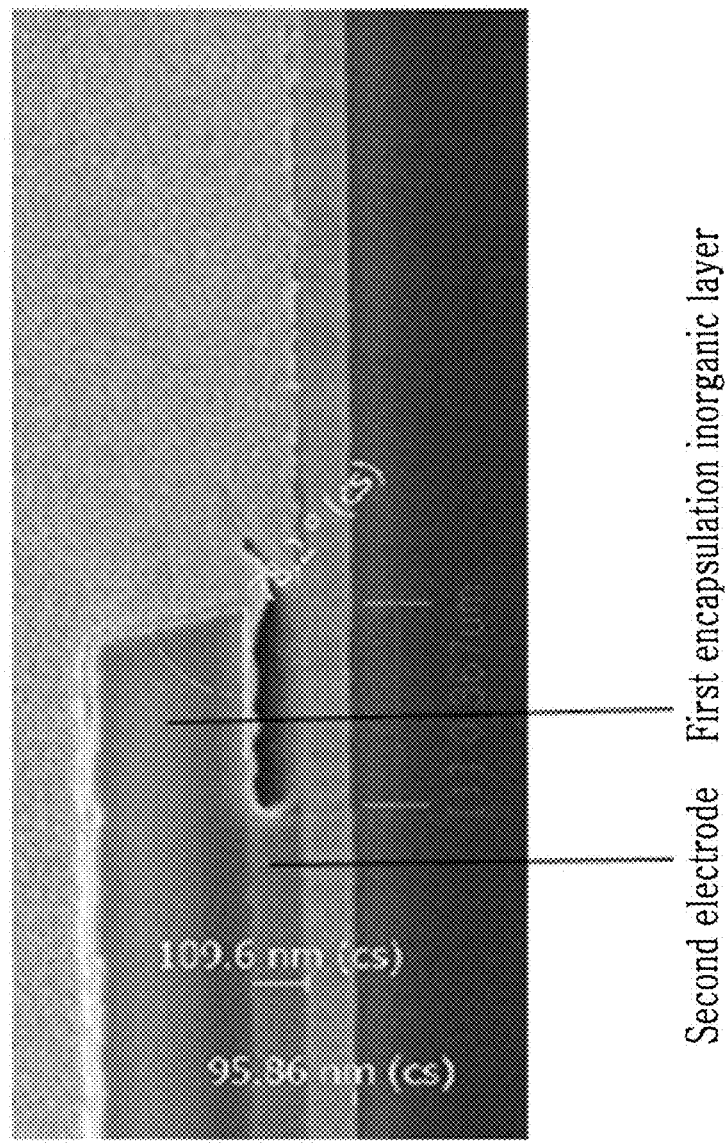
FIG. 9 illustrates a cross-sectional image of a second electrode and a first encapsulation inorganic layer manufactured by the manufacturing method of FIGS. 8A, 8B, 8C, 8D, and 8E.

Hereinafter, a cross-section of the second electrode and the encapsulation inorganic layer according to an embodiment will be described with reference to FIG. 9. FIG. 9 illustrates the cross-section image of the second electrode and the first encapsulation inorganic layer manufactured according to an embodiment.

As illustrated in FIG. 9, when a patterning process was performed by using tetra methyl ammonium hydroxide (TMAH) for the second electrode and the first encapsulation inorganic layer formed to overlap the entire surface of the substrate, it was confirmed that in the first encapsulation inorganic layer and the second electrode, the undercut of a stable shape was formed.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate having an opening area, a peripheral area surrounding the opening area, and a display area surrounding the peripheral area;
   a transistor disposed on the substrate;
   a first electrode electrically connected to the transistor;
   an emission layer disposed on the first electrode;
   a second electrode disposed on the emission layer;
   a first encapsulation inorganic layer, an encapsulation organic layer, and a second encapsulation inorganic layer disposed on the second electrode; and
   an electronic module disposed in the opening area,
   wherein in the peripheral area, the second electrode has a first opening exposing the emission layer, and the first encapsulation inorganic layer has a second opening exposing the emission layer.

2. The display device of claim 1, wherein in a cross-sectional view, the first opening of the second electrode has a width larger than a width of the second opening of the first encapsulation inorganic layer.

3. The display device of claim 1, wherein in the peripheral area, the first encapsulation inorganic layer and the second electrode have an undercut shape in a cross-sectional view.

4. The display device of claim 1, wherein the encapsulation organic layer fills the first opening of the second electrode and the second opening of the first encapsulation inorganic layer.

5. The display device of claim 4, wherein the encapsulation organic layer is in contact with the emission layer exposed in the peripheral area.

6. The display device of claim 1, wherein the first electrode and the emission layer extend from the display area to the peripheral area.

7. The display device of claim 1, wherein the second electrode comprises at least two layers.

8. The display device of claim 7, wherein the at least two layers of the second electrode comprise a layer formed of molybdenum (Mo) and a layer formed of aluminum (Al).

9. The display device of claim 1, wherein the display device further comprises a third encapsulation inorganic layer disposed between the first encapsulation inorganic layer and the encapsulation organic layer.

10. The display device of claim 9, wherein the third encapsulation inorganic layer is in contact with the emission layer exposed in the peripheral area.

11. The display device of claim 9, wherein the third encapsulation inorganic layer is disposed in the first opening of the second electrode and the second opening of the first encapsulation inorganic layer.

12. A display device comprising:
    a substrate having an opening area, a peripheral area surrounding the opening area, and a display area surrounding the peripheral area;
    a transistor disposed on the substrate;
    a first electrode electrically connected to the transistor;
    an emission layer disposed on the first electrode;
    a second electrode disposed on the emission layer; and
    a first encapsulation inorganic layer, an encapsulation organic layer, and a second encapsulation inorganic layer disposed on the second electrode,
    wherein the first electrode and the emission layer extend from the display area to the peripheral area;
    the second electrode has a first opening exposing the emission layer in the peripheral area;
    the first encapsulation inorganic layer has a second opening exposing an upper surface of the emission layer; and
    in the peripheral area, the first encapsulation inorganic layer and the second electrode form an undercut shape in a cross-sectional view.

13. The display device of claim 12, further comprising an electronic module disposed in the opening area.

14. The display device of claim 12, wherein in a cross-sectional view, the first opening of the second electrode has a width larger than a width of the second opening of the first encapsulation inorganic layer.

15. The display device of claim 12, wherein the encapsulation organic layer fills the first opening of the second electrode and the second opening of the first encapsulation inorganic layer.

16. The display device of claim 12, wherein the second electrode comprises at least two layers.

17. The display device of claim 12, wherein the display device further comprises a third encapsulation inorganic layer disposed between the first encapsulation inorganic layer and the encapsulation organic layer.

18. The display device of claim 17, wherein the third encapsulation inorganic layer is in contact with the emission layer exposed in the peripheral area.

19. The display device of claim 17, wherein the third encapsulation inorganic layer is disposed in the first opening of the second electrode and the second opening of the first encapsulation inorganic layer.

20. The display device of claim 12, wherein the second electrode comprises aluminum.

* * * * *